United States Patent [19]

Rouse et al.

[11] Patent Number: 5,322,814
[45] Date of Patent: Jun. 21, 1994

[54] MULTIPLE-QUANTUM-WELL SEMICONDUCTOR STRUCTURES WITH SELECTIVE ELECTRICAL CONTACTS AND METHOD OF FABRICATION

[75] Inventors: Irving D. Rouse, Ventura; Wei-yu Wu, Calabasas, both of Calif.

[73] Assignee: Hughes Aircraft Company, Los Angeles, Calif.

[21] Appl. No.: 81,951

[22] Filed: Aug. 5, 1987

[51] Int. Cl.$^5$ .................. H01L 21/20; H01L 21/306
[52] U.S. Cl. ........................... 437/110; 437/5; 437/184; 437/185; 148/DIG. 72; 156/649; 156/656
[58] Field of Search ............. 148/DIG. 160, DIG. 51, 148/DIG. 72, DIG. 45; 204/129.3; 156/633, 648, 649, 652, 656; 437/2, 3, 4, 5, 225, 942, 184, 185, 187, 170, 173, 110, 108

[56] References Cited

U.S. PATENT DOCUMENTS

| | | | |
|---|---|---|---|
| 4,404,072 | 9/1983 | Kohl et al. | 204/129.3 |
| 4,411,728 | 10/1983 | Sakamoto | 437/110 |
| 4,414,066 | 11/1983 | Forrest | 204/129.3 |
| 4,576,691 | 3/1986 | Kohl et al. | 204/129.3 |
| 4,622,114 | 11/1986 | Glass et al. | 204/129.3 |
| 4,642,144 | 2/1987 | Tiedje et al. | 437/110 |
| 4,675,086 | 6/1987 | Davies et al. | 204/129.3 |

FOREIGN PATENT DOCUMENTS

| | | | |
|---|---|---|---|
| 0139505 | 2/1985 | European Pat. Off. | 437/110 |
| 1143273 | 2/1963 | Fed. Rep. of Germany | 204/129.3 |

OTHER PUBLICATIONS

Klaus Ploog and G. Dohler, "Compositional and doping superlattices in III-V semiconductors", Advances in Physics, vol. 32, No. 3, 1983, pp. 285-359.
G. H. Dohler, "The Potential of n-i-p-i Doping Superlattices for Novel Semiconductor Devices", Superlattices and Microstructures, vol. 1, No. 3, 1985, pp. 279-287.
G. H. Dohler, "Light Generation, Modulation, and Amplification by n-i-p-i doping superlattices", Optical Engineering, vol. 25, No. 2, Feb. 1986, pp. 211-218.
Y. Horikoshi and K. Ploog, "A New Doping Superlattice Photodetector", Applied Physics A 37, 1985, pp. 47-56.
F. Shinoki, et al., "Nioblum nitride Josephson tunnel junctions with oxidized amorphous silicon barriers", Applied Physics Letters, vol. 38(4), Feb. 1981, p.285.
G. H. Dohler et al., "In situ grown-in selective contacts to n-i-p-i doping superlattice crystals using molecular beam epitaxial growth through a shadow mask", Applied Physics Letters, vol. 49, Sep. 1986, pp. 704-706.

(List continued on next page.)

*Primary Examiner*—Peter A. Nelson
*Attorney, Agent, or Firm*—V. D. Duraiswamy; W. K. Denson-Low

[57] ABSTRACT

A method is provided for forming selective electrical contacts on a structure of alternating ultrathin semiconductor layers of two different types, so that electrical connection can be made separately to the layers of a given type. Selective etching of first one type of layers at one side of the structure and then the second type of layers at another side produces digitate edge patterns suitable for deposition of ohmic contacts. Any method can be used which directs particles of a conducting material onto the digitate edge portions at an angle to build up material on only one set of layers at a time. The gaps between adjacent protruding layers of the same doping type are filled in as the deposition continues. In this way the high-temperature steps required for diffusion or ion implantation activation are avoided. For a mesa-etched n-i-p-i chip the contact is allowed to extend onto adjacent regions of the supporting wafer so that further electrical contacting can be done in those regions. The invention also encompasses etched structures with digitate edge patterns to which selective contacts have been applied, providing various kinds of electro-optic devices such as optical modulators and photodetectors.

22 Claims, 3 Drawing Sheets

OTHER PUBLICATIONS

R. M. Osgood, Jr., et al., "Localized laser etching of compound semiconductors in aqueous solution", Applied Physics Letters, vol. 40, No. 5, Mar. 1982, pp. 391–393.

S. Mottet and L. Henry, "Photochemical Microetching of GaAs", Electronics Letters, vol. 19, No. 22, Oct. 1983, pp. 919–920.

E. Haroutiounian et al., "Electrochemical and Photoelectrochemical Behavior and Selective Etching of III-V Semiconductors in $H_2O_2$ as Redox System", J. Electrochemical Society, vol. 131, No. 1, Jan. 1984, pp. 27–34.

J. van de Ven, "The Mechanism of GaAs Etching in $CrO_3$-HF Solutions", J. Electrochemical Society, vol. 132, No. 12, Dec. 1985, pp. 3020–3033.

F. Shinoki, et al., "Nioblum nitride Josephson tunnel junctions with oxidized amorphous silicon barriers", Applied Physics Letters, vol. 38(4), Feb. 1981, p. 285.

G. H. Dohler et al., "In situ grown-in selective contacts to n-i-p-i doping superlattice crystals using molecular beam epitaxial growth through a shadow mask", Applied Physics Letters, vol. 49, Sep. 1986, pp. 704–706.

G. H. Dohler, "Light Generation, Modulation, and Amplification by n-i-p-i doping superlattices", Optical Engineering, vol. 25, No. 2, Feb. 1986, pp. 211–218.

Y. Horikoshi and K. Ploog, "A New Doping Superlattice Photodetector", Applied Physics A 37, 1985, pp. 47–56.

Klaus Ploog and G. Dohler, "Compositional and doping superlattices in III-V semconductors", Advances in Physics, vol. 32, No. 3, 1983, pp. 285–359.

G. H. Dohler, "The Potential of n-i-p-i Doping Superlattices for Novel Semiconductor Devices", Superlattices and Microstructures, vol. 1, No. 3, 1985, pp. 279–287.

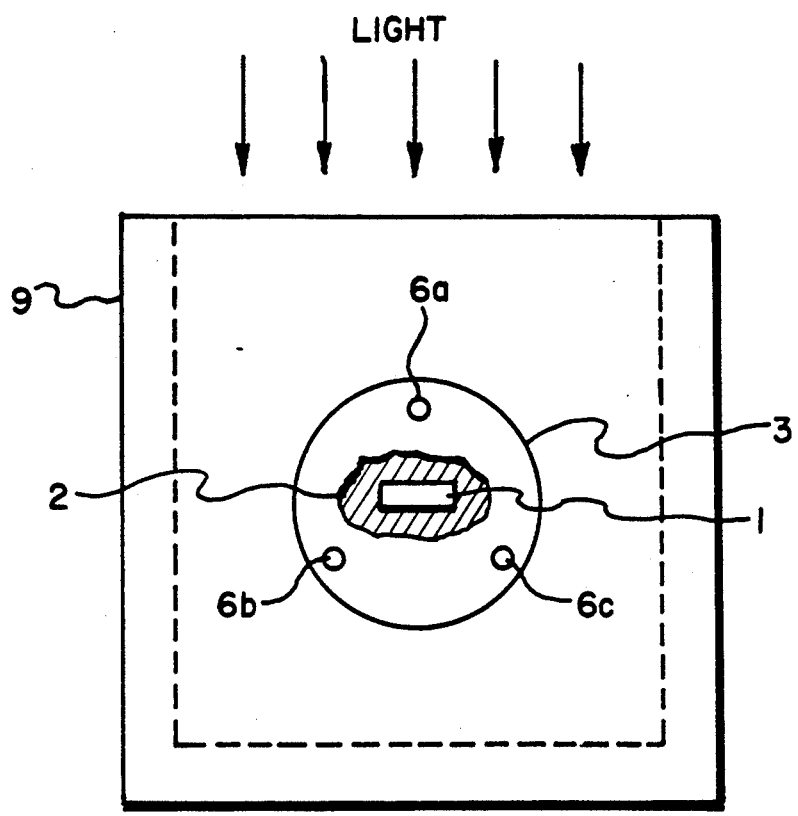
FIG.1.A.
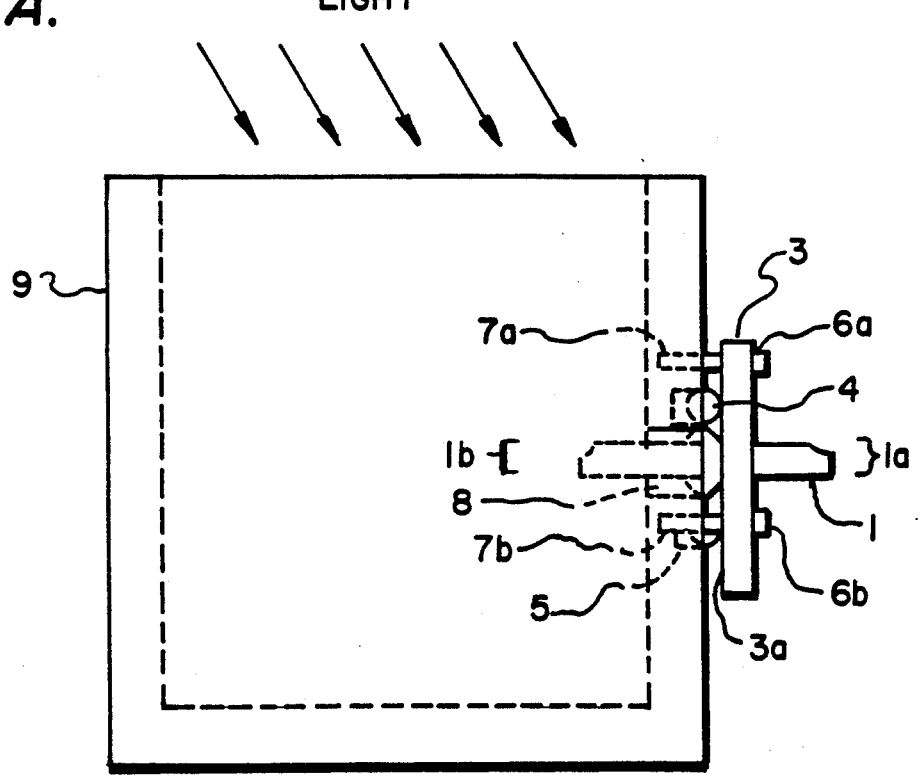
FIG.1.B.

MULTIPLE-QUANTUM-WELL SEMICONDUCTOR STRUCTURES WITH SELECTIVE ELECTRICAL CONTACTS AND METHOD OF FABRICATION

GOVERNMENT RIGHTS IN INVENTION

This invention was made with U.S. Government support under Contract No. F30602-86-C-0030, awarded by the Department of the Air Force. The U.S. Government has certain rights in this invention.

BACKGROUND OF THE INVENTION

Related Patent Application

This application is related to co-pending application Ser. No. 081,950, filed August 5 concurrently with this application by Wei-yu Wu and assigned to Hughes Aircraft Company, the assignee of this invention.

Field of the Invention

This invention relates to methods for etching first and second types of semiconductor material to prepare structures of alternating ultrathin semiconductor layers, and in particular to forming selective electrical contacts on these structures.

Description of Related Art

The field of photonics combines laser physics, electro-optics, and nonlinear optics. An example of a photonic system is found in lightwave communications, where optical signals are generated, modulated, transmitted, and detected before they are changed into electrical form for ultimate use. Information processing provides another example of the application of photonics. There are several advantages of optical processing of information over electrical processing, which is limited in speed by pulse broadening in interconnected wires and in density by crosstalk between wires. Only the difficulty in developing convenient digital optical logic elements with low switching energy prevents the realization of optical systems having the capacity to handle extremely large quantities of information.

An ideal material for electro-optic applications would be able to transform current into light and vice versa for emission and detection. This ideal material would also display large optical and electronic nonlinearities which would permit its utilization as an optical gate and transistor. The material could be used for optical modulation by exploiting both nonlinearities simultaneously.

Semiconductor structures consisting of stacks of ultrathin layers are called superlattices or quantum-well structures. There are an enormous number of potential applications in photonics for devices made from these structures. The compound III-V semiconductors, which are made from elements of Groups III and V of the periodic table, are well suited for the fabrication of quantum-well structures. In these materials the energy band gap is direct, which means that light can be emitted or absorbed without the aid of lattice vibrations, in a very efficient process. Charge carrier mobilities are very large in these materials, and they are easily doped with impurities. From the structural point of view, it is very important that these materials can form solid solutions of various proportions with identical crystal structures and well-matched lattice parameters but with different energy bandgaps and indices of refraction.

Superlattices and quantum-wall structures are fabricated using the methods of molecular beam epitaxy (MBE) and metal-organic vapor deposition. These techniques make use of an ultraclean environment in combination with a slow growth rate to produce epitaxially grown materials. Junctions between different semiconductor materials (heterojunctions) can be made which are planar and atomically abrupt. Using growth rates as low as 1 Angstrom/second, it is possible to fabricate layered structures with layer thicknesses in the range from a few Angstroms to a few micrometers. Such multilayered structures display new properties not shown by the bulk semiconductor compounds.

One type of superlattice is the "doping superlattice," which is obtained by periodically alternating n and p doping during the growth of an otherwise uniform semiconductor such as gallium arsenide (GaAs). Originally the fabrication of doping superlattices with intrinsic layers in between the doped layers gave rise to the designation of "n-i-p-i" crystals. Doping superlattices in semiconductors provide modulation of the energy bands characterized by peaks and valleys. Holes sit on top of the peaks and electrons sit in the valleys. Electrons and holes are effectively spatially separated and confined. Characteristic series of energy subbands are created. Quantization of the carrier motion in the direction perpendicular to the layers produces a set of discrete energy levels. The effective energy gap can be set between zero and the gap of the host material by appropriately choosing the doping concentrations and thicknesses of the constituent layers. Also, the energy gap can be tuned by injecting carriers electrically and optically. Doping superlattices exhibit a variety of interesting new properties, such as extremely long lifetimes for electron-hole recombination, tunable electron and hole conductivities, very large photoconductive response, tunable absorption, tunable luminescence, and tunable optical gain.

A basic discussion of the n-i-p-i structure is given in an article by Klaus Ploog and Gottfried H. Dohler, "Compositional and Doping Superlattices in III-V Semiconductors", *Advances In Physics*, Vol. 32, No. 3, 1983, pages 285-359. This article presents a general discussion of n-i-p-i structures, as well as the spatial control of optical absorption by a voltage pattern applied to the n-i-p-i structure. Other applications, such as in photoconductors, photodiodes, ultrafast photodetectors, light emitting devices, and optical absorption modulators, are discussed in an article by Dohler, "The Potential of n-i-p-i Doping Superlattices For Novel Semiconductor Devices", *Superlattices and Microstructures*, Vol. 1, No. 3, 1985, pages 279-287. A further expansion on n-i-p-i applications is provided in another article by Dohler, "Light Generation, Modulation, and Amplification by n-i-p-i Doping Superlattices," *Optical Engineering*, Vol. 25, No. 2, February, 1986, pages 211-218.

In order to exploit the unique electro-optical properties of n-i-p-i crystals it would be desirable to find a way of applying separate contacts to the sets of n and p layers of these structures. The fabrication of such so-called selective contacts has been attempted in different ways, but without success at doping levels high enough (at least $5 \times 10^{18}$) to get sufficient energy band modulation.

Horikoshi and Ploog describe one attempt to fabricate selective n-i-p-i contacts in their article "A New Doping Superlattice Photodetector" in Applied Physics A37, pp. 47-56, published in 1985. The method consists of providing n+ and p+ regions extending perpendicular to the layers on the two far edges and alloying small Sn and Sn/Zn balls to these regions to form the selective electrodes. The material in the balls is diffused through the layers by heating, and the heat required tends to move the dopant atoms in the layers. The blocking junctions tend to be leaky. Another attempt is described by Kuenzel et al. in Applied Physics Letters 38, at page 285, published in 1981. It makes use of evaporated and subsequently annealed Ni/Sn and Au/Zn contacts on etched n-i-p-i mesas, grown on undoped substrates. Neither of the techniques described above yields satisfactory results for GaAs n-i-p-i structures with doping levels greater than about $10^{17}$ cm$^{-3}$. At doping concentrations significantly above $10^{18}$ cm$^{-3}$ the contacts have turned out to be hardly selective at all in GaAs. The situation is even worse for n-i-p-i crystals made from lower bandgap material such as InGaAs.

An improved but more complicated method of making selective contacts is described by Doehler et al. in their article "In situ grown-in selective contacts to n-i-p-i doping superlattice crystals using molecular beam epitaxial growth through a shadow mask" in Applied Physics Letters 49, pp. 704–706, published in 1986. The method is restricted to n-i-p-i structures made by molecular beam epitaxy techniques. It makes use of atomic or molecular beams having different angles of incidence onto the substrate. The donor or acceptor beams are shadowed in certain parts of the regions where high-quality bulk material is growing. A silicon wafer with rectangular windows etched through it is placed on top of the GaAs wafer as a shadow mask. The mask is oriented such that the dopant beams are incident at equal angles with respect to the windows. When an n-p-n-p superlattice is being grown, on one side an n-i-n-i structure results and on the other a p-i-p-i structure. Due to the finite shadow width a laterally graded p-n junction barrier is grown in for each contact to its oppositely doped layer. Since practically no holes are present in the n-i-n-i regions, the only requirement for the metal contact to be applied to this structure is good ohmic behavior to n-type material. The corresponding requirement applies to the p-type metal contact. The disadvantages of this technique are that it requires special molecular beam epitaxy equipment, that only one device per wafer can be made, that it does not yield sharp boundaries at the contacts, and that it cannot be used for n-i-p-i structures made by liquid-phase epitaxy or metal-organic vapor deposition.

SUMMARY OF THE INVENTION

In view of the foregoing problems associated with the prior art, a purpose of the invention is to furnish a novel and improved method of forming selective electrical contacts on a structure of alternating ultrathin semiconductor layers, for allowing electrical contact to be made separately to the p-type and n-type layers of n-i-p-i photonic devices.

Another purpose of this invention is to provide a method of forming selective electrical contacts on a large number of n-i-p-i structures on a single wafer at the same time.

The invention also includes provision of novel and useful semiconductor devices comprising selectively etched n-type or p-type semiconductor structures with separate electrical contacts to each type of doped layers.

In the accomplishment of these and other purposes of the invention, a method is provided for forming selective electrical contacts on a structure of alternating ultrathin semiconductor layers, so that electrical connection can be made separately to the two types of layers. Selective etching of first one type of layers at one end of the structure and then the other type of layers at the other end produces digitate edge patterns suitable for application of ohmic contacts by metal deposition. Beams of metal molecules are then directed onto the digitate edge portions at an angle to build up metallic material on only one set of layers at a time. The gaps between adjacent protruding layers of the same type are filled in as the metal deposition continues. In this way the high-temperature steps required for diffusion or ion implantation activation are avoided. For a mesa-etched n-i-p-i chip the contact metallization is allowed to extend onto adjacent regions of the supporting wafer so that further electrical contacting can be done in those regions. The invention also encompasses etched structures with digitate edge patterns to which selective contacts have been applied; such structures can be used in various kinds of electro-optic devices such as optical modulators and photodetectors.

These and other features and advantages of the invention will be apparent to those skilled in the art from the following detailed description of preferred embodiments, taken together with the accompanying drawings, in which like reference numerals refer to like parts.

BRIEF DESCRIPTION OF THE DRAWINGS

FIG. 1a is a front elevation view of a setup for selectively etching material of a given type from a doping or compositional superlattice structure.

FIG. 1b is a side elevation view of the setup of FIG. 1a.

DESCRIPTION OF THE PREFERRED EMBODIMENT

Figure 2:
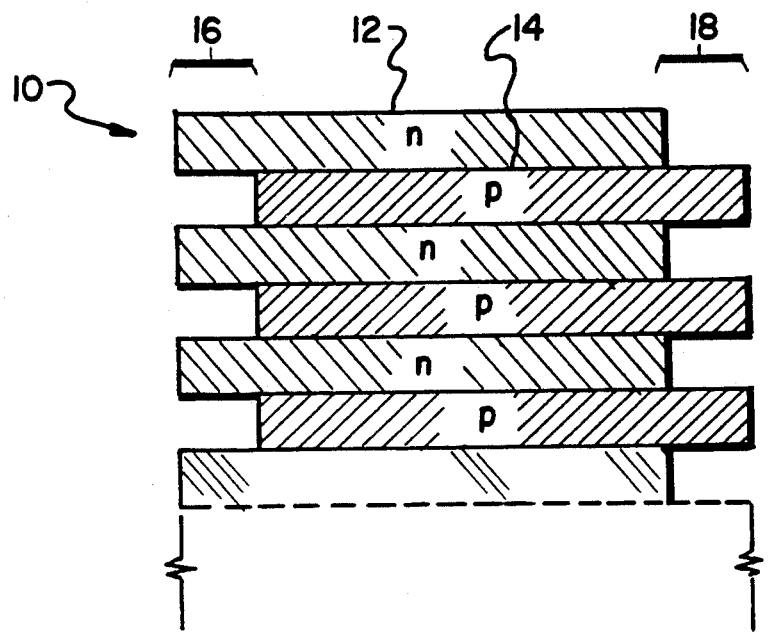
FIG. 2 is a sectional view showing a semiconductor structure of alternating n-doped and p-doped layers after selective etching has been done to produce digitate edge patterns.

The invention uses a chemical reaction to selectively etch doping or compositional superlattice chips so that electrical contacts can be applied separately to the alternating layers. This makes possible the exploitation of unusual electro-optic properties associated with these superlattice chips. By selectively etching one type of material at one end of the chip and then selectively etching the other type of material at the opposite end of the chip, two digitate edge patterns are formed. In the case of doping superlattice structures the n-type layers protrude beyond the p-type layers at one end, and the p-type layers protrude beyond the n-type layers at the other end. Semiconductor structures of interleaved layers with sharply defined digitate edge patterns can be produced in this way.

The present invention makes it possible to fabricate electrical contacts separately on the sets of n-type layers and p-type layers of doping superlattices, or on the different sets of layers in compositional superlattices. The fabrication of these so-called selective electrical contacts allows exploitation of the unusual electro-optic properties associated with these superlattices.

Compositional superlattice structures have alternating ultrathin layers of different materials, for example GaAs and GaAlAs. Digitate edge patterns can be made on these types of structures using selective chemical etchants for the different materials.

In the U.S. Patent Application entitled "Electrochemically Etched Multilayer Semiconductor Structures," by Wei-yu Wu, Serial Number 081,950, filed Aug. 5, 1987, and assigned to Hughes Aircraft Company, the assignee of the prevent invention, a method is disclosed for using an electrochemical reaction to selectively etch GaAs n-i-p-i superlattice chips. An electrochemical etching reaction is used because the sign of the charge of the majority carriers is different in n-type and p-type materials. Since a special polarity of charge carrier is needed to dissolve a given type of material, selective etching of that material can be accomplished in the presence of the opposite type of doping.

In either case, doping superlattice or compositional superlattice, because of the extreme thinness of the alternating layers it is not possible to use a photolithographic mask to put down a contact pattern of selective contacts to the different types of layers. The present invention for forming selective contacts applies to any type of digitate edge pattern of layers, since it depends only on the geometry of the pattern.

FIGS. 1a and 1b are front and side elevation views, respectively, of a setup for selectively etching material of a given type from a doping or compositional superlattice structure. A sample semiconductor superlattice structure 1 is mounted with a black wax 2 in a slot in a Teflon sample holder 3. Face 3a of sample holder 3 is mounted against an "O"-ring 4 in a circular groove 5 by means of bolts 6a,b,c screwed into tapped holes 7a,b,c. Groove 5 surrounds a sample port 8 in a sample etching chamber 9. After sample 1 and its holder 3 are mounted on etching chamber 9, the interior of chamber 9 is filled with a suitable etchant for selectively etching one type of material from an end 1a of the sample 1. The end 1a consists of edges of the alternating layers of the two different types of semiconductor materials. Chamber 9 has no top, to allow for illumination of the sample if that is a requirement of the particular etching reaction being used. Conversely, if it is desired to carry out the etching in the absence of light, chamber 9 can be covered with some opaque material.

After end 1a of the sample 1 has been selectively etched, the chamber 9 is emptied and the holder 3 removed. The opposite face 3b is now mounted against "O"-ring 4 so that the opposite end 1b of sample 1 is inside the chamber 9. The chamber is then filled with a new etchant to selectively etch the other type of semiconductor material.

Various etchants and etching reactions that may be used to carry out the method of the present invention have been published in the scientific literature. Etching reactions for the compound semiconductors GaAs, CdS, and InP are described in "Localized laser etching of compound semiconductors in aqueous solution," by R.M. Osgood et al. in Appl. Phys. Lett., Vol 40, Number 5, pp. 391-393, 1 March 1982. In particular, the laser-enhanced etching of n-type GaAs in an aqueous solution of KOH is described in that publication. A related publication is "Photochemical Microetching of GaAs," by S. Mottet and L. Henry, in Electronics Letters, Vol. 19, No. 22, pp. 919-920, 27th October, 1983. The etching of the compound semiconductors GaAs, GaAlAs, and GaAsP using $H_2O_2$ is described in "Electrochemical and Photoelectrochemical Behavior and Selctive Etching of III-V Semiconductors in $H_2O_2$ as Redox System," by Haroutiounian et al., in J. Electrochem. Soc., Vol. 131, No. 1, pp. 27-34, January, 1984. Finally, the etching of n- and p-type GaAs by a solution of $CrO_3$−HF is described in "The Mechanism of GaAs Etching in $CrO_3$−HF Solutions," by J. van de Ven et al., J. Electrochem. Soc., Vol. 132, No. 12, pp. 3020-3033, Dec. 1985.

The type of selectively etched semiconductor structure produced by the method described above is illustrated by FIG. 2. In FIG. 2 an n-i-p-i superlattice structure 10 with digitate edge portions is shown. Apart from the edge portions such a structure can be grown by molecular beam epitaxy using doped gallium arsenide, for example. The structure typically consists of about 500 alternating n-type layers 12 and p-type layers 14, each having a thickness of approximately 100 Angstroms. FIG. 2 shows the desired types of digitate edge patterns 16 and 18 that result from selective etching. At the left side of the structure the p-type layers 14 have been etched away to form the digitate edge pattern 16, and at the right side of the structure the n-type 12 layers have been etched away to form the digitate edge pattern 18. Electrical contacts can now be fabricated on the protruding n-type layers 12 of the edge pattern 16, and on the protruding p-type layers 14 of the edge pattern 18.

Figure 3:
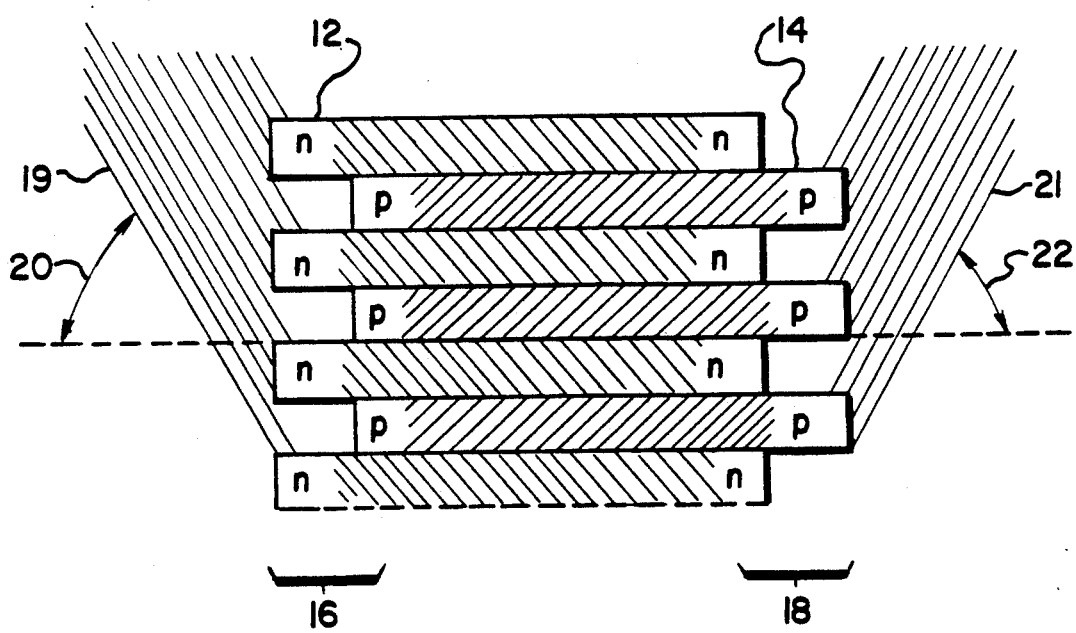
FIG. 3 shows the same structure as FIG. 2 with the method of the present invention being use to fabricate selective electrical contacts.

The process of forming the contacts proceeds as shown in FIG. 3. A beam of particles 19 of a conducting material, such as atoms or molecules of a metal, is provided that impinges on the digitate edge pattern 16 at an angle 20 with respect to the planes of the layers. In practice the sample is photomasked with an opening in the resist for the contact area. The beam of metal atoms can be provided by evaporation of a heated metal source in high vacuum or in a low-pressure inert atmosphere. The technique of electron beam bombardment can be used for heating the metal source. The metal atoms can also be provided by the well-known technique of sputtering. Apparatus for electron beam evaporation and sputtering are commercially available. Various types of contact materials may be employed; in the case of a GaAs n-i-p-i structure, AuMn is suitable for the p-type ohmic contact and AuGeNi for the n-type ohmic contact, among other materials.

The angle 20 is chosen so that metal is deposited only on the n-type layers 12 in the region of the digitate edge pattern 16. For example, if the n-type and p-type layers both have thicknesses of about 100 Angstroms, and if the p-type layers have been etched to a depth of about 200 Angstroms, then the angle 20 should be substantially greater than arctan $(\frac{1}{2}) \cong 27°$ in order to prevent any metal atoms from impinging on the p-type layers.

Similarly, a beam of metal atoms 21 is provided to impinge at an angle 22 on the digitate edge pattern 18 to form the selective electrical contact to the p-type layers 14. Again the angle 22 is chosen so that metal atoms are prevented from striking the n-type layers.

Figure 4:
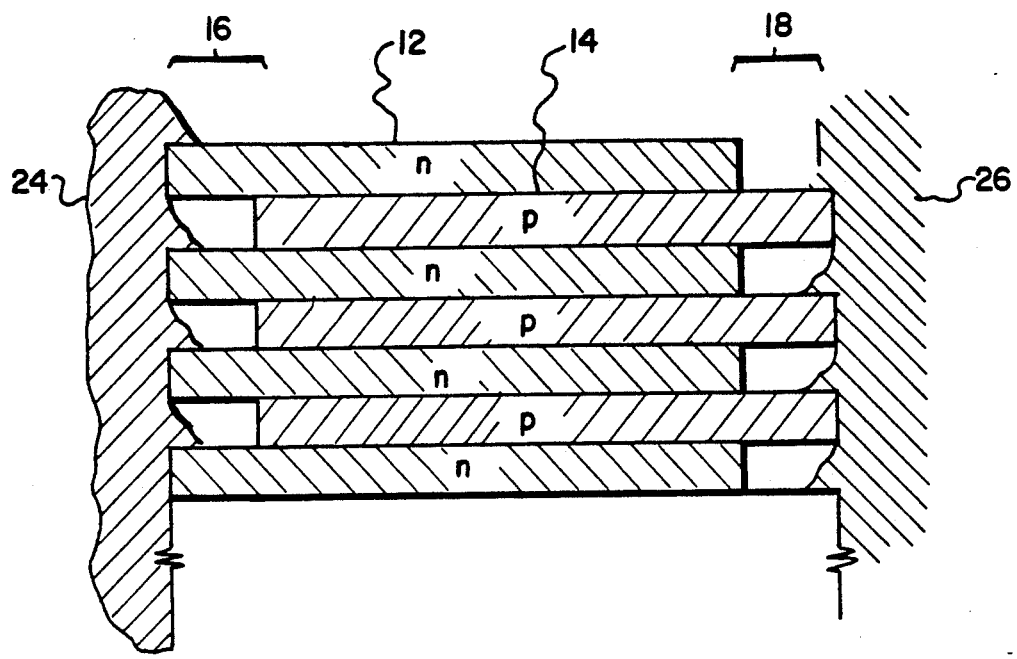
FIG. 4 shows the completed selective electrical contacts.
Figure 5:
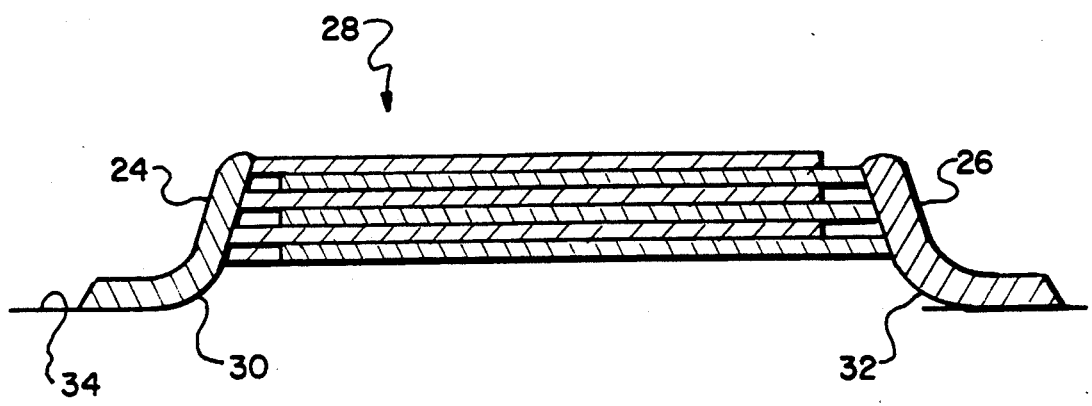
FIG. 5 is a sectional view of a mesa-etched n-i-p-i structure on an intrinsic substrate with contact metallization extending onto the substrate.

The completed ohmic contacts 24 and 26 are shown in FIG. 4. Typically they will have thicknesses of about 2000 Angstroms. For the particular case of n-type and p-type GaAs, especially at high doping levels, materials that make ohmic contact to one type of doped layer will also make ohmic contact to the other type of doped layer. For this reason it is important that the ohmic contact 24 touch only the n-type layers 12 and the ohmic contact 26 touch only the p-type layers 14. All the p-n junctions in parallel are now accessible through the contacts 24 and 26. The sample is given a rapid thermal anneal after the contact metallization process is completed. The temperature during the anneal is low enough and the duration of the anneal short enough so that good contact is provided without moving the dopant atoms in the layers of the device.

In the usual case, the alternating n-type and p-type layers are grown on a wafer substrate of intrinsic purity. After the many alternating n- and p-type layers are grown, typically several hundred of them, etching of the multilayer structure can be carried out to produce a large number of n-i-p-i chips such as the one shown in FIG. 4. The n-i-p-i chip 28 has the familiar mesa structure that is a natural concomitant of the etching process. The contact metallization is extended onto the adjoining regions 30 and 32 of the supporting wafer 34 of material having intrinsic conductivity. Attachment of electrical leads to the selective contacts 24 and 26 can now be made above the regions 30 and 32, avoiding direct mechanical connection to the somewhat fragile n-i-p-i structure 10.

The present invention has been described in detail with reference to a particular GaAs embodiment. However, it is also applicable to n-i-p-i structures formed from other semiconductor materials, particularly silicon. Equivalent fabrication procedure:. could be employed with etchants and contacts that are suitable for silicon. Since other variations and alternate embodiments will occur to those skilled in the art, it is intended that the invention be limited only in terms of the appended claims.

What is claimed is:

1. A method of providing selective electrical contacts for multiple quantum-well semiconductor structures having alternating layers of first and second types of semiconductor material including the steps of:
   a) selectively etching material of said second type from a first side surface of said structure on which said alternating layers terminate to produce a digitate edge pattern of protruding layers of said first semiconductor type interleaved with recessed layers of said second semiconductor type then
   b) forming an electrical contact with one or more of said protruding layers of said first semiconductor type.

2. The method of claim 1, further comprising the step or forming a common electrical contact on said protruding layers of said first type by directing beams of particles of one or more conducting materials onto said digitate edge pattern of said structure for a predetermined period of time at such an angle with respect to said layers of said structure that said particles attach to only said protruding layers.

3. The method of claim 2, in which said step of forming a common electrical contact is carried out by evaporation of said conducting materials in vacuum.

4. The method of claim 2, in which said step of forming a common electrical contact is carried out by evaporation of said conducting materials in a low-pressure atmosphere of one or more inert gases.

5. The method of claim 2, in which said step of forming a common electrical contact is carried out by sputtering of said conducting materials.

6. A method of modifying a semiconductor mesa structure comprising alternating layers of first and second semiconductor types on a substrate in fabricating a semiconductor electronic device, to form a first digitate edge pattern of protruding layers of said first type interleaved with recessed layers of said second type, and a second digitate edge pattern of protruding layers of said second type interleaved with recessed layers of said first type, comprising the steps of:
   a) selectively etching said first type of material from a first side surface of said structure on which all said layers terminate; and
   b) selectively etching said second type of material from a second side surface of said structure on which all said layers terminate.

7. The method of claim 6, in which said etching is accomplished in step a) by applying to said first side surface of said structure an etchant that selectively etches said first type of material for a first predetermined length of time under a first effective amount of illumination, and in step b) by applying to said second side surface of said structure an etchant that selectively etches said second type of material for a second predetermined length of time under a second effective amount of illumination.

8. The method of claim 7, wherein said first type of material is p-type GaAs, step a) is carried out in the absence of light using an aqueous solution of $CrO_3$-HF, said second type of material is n-type GaAs, and step b) is carried out in the presence of laser light using an aqueous solution of $CrO_3$-HF.

9. The method of claim 6, further comprising the step of forming a common electrical contact on said protruding layers of said first type in said first digitate edge pattern and on an adjoining region of said substrate by directing particles of one or more conducting materials onto said digitate edge pattern and said adjoining region of said substrate for a predetermined period of time at such an angle with respect to said layers of said structure that said particles attach to only protruding layers of said first type on said digitate edge pattern and said adjoining region of said substrate.

10. The method of claim 9, in which said step of forming a common electrical contact is carried out by evaporation of said conducting materials in vacuum.

11. The method of claim 9, in which said step of forming a common electrical contact is carried out by evaporation of said conducting materials in a low-pressure atmosphere of one or more inert gases.

12. The method of claim 9, in which said step of forming a common electrical contact is carried out by sputtering of said conducting materials.

13. The method of claim 6, further comprising the steps of:
   c) forming a first common electrical contact on said protruding layers of said first type in said first digitate edge pattern by directing particles of one or more conducting materials onto said first digitate edge pattern of said structure for a predetermined period of time at such an angle with respect to said layers of said structure that said particles attach to only protruding layers of said first type in said first digitate edge pattern, and
   d) forming a second common electrical contact on said protruding layers of said second type in said second digitate edge pattern by directing particles of one or more conducting materials onto said second digitate edge pattern of said structure for a predetermined period of time at such an angle with respect to said layers of said structure that said particles attach to only protruding layers of said second type in said second digitate edge pattern.

14. The method of claim 13, in which steps 1) and 2) are carried out by evaporation of said conducting materials in vacuum.

15. The method of claim 13, in which steps 1) and 2) are carried out by evaporation of said conducting materials in a low-pressure atmosphere of one or more inert gases.

16. The method of claim 13, in which steps 1) and 2) are carried out by sputtering of said conducting materials.

17. The method of claim 13, wherein said semiconductor layers are substantially gallium arsenide.

18. The method of claim 13, wherein said semiconductor layers are substantially gallium arsenide.

19. The invention of claim 1 wherein said selective etching step includes the step of:
selectively etching material of said first type from a second side surface of said structure on which said alternating layers terminate to produce a digitate edge pattern of protruding layers of said second semiconductor type interleaved with recessed layers of said first semiconductor type.

20. The invention of claim 1 wherein said selective etching step includes the steps of:
selectively applying a photosensitive etchant to said first surface and
illuminating said first surface to activate said etchant.

21. The invention of claim 19 wherein said selective etching steps includes the steps of:
selectively applying a photosensitive etchant to said surfaces and
illuminating said surfaces to activate said 22. The invention of claim 19 wherein said step of forming an electrical contact includes the step of:
forming an electrical contact with one or more of said protruding layers of said second semiconductor type.

* * * * *